(12) United States Patent
Ayyapureddi (10) Patent No.: US 10,600,498 B1
(45) Date of Patent: Mar. 24, 2020

(54) REDUCED FOOTPRINT FUSE CIRCUIT

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/287,850

(22) Filed: Feb. 27, 2019

(51) Int. Cl.
*G11C 29/00* (2006.01)
*H03K 19/20* (2006.01)

(52) U.S. Cl.
CPC ......... *G11C 29/812* (2013.01); *G11C 29/789* (2013.01); *G11C 29/80* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 7,046,560 B2 | 5/2006 | Ayyapureddi et al. | |
| 10,332,609 B1* | 6/2019 | Riley | G11C 29/812 |
| 2004/0019763 A1 | 1/2004 | Lakhani et al. | |
| 2005/0122799 A1* | 6/2005 | Hojo | G11C 29/787 |
| | | | 365/200 |
| 2011/0205796 A1* | 8/2011 | Kim | G11C 29/846 |
| | | | 365/185.09 |

* cited by examiner

*Primary Examiner* — Tan T. Nguyen
(74) *Attorney, Agent, or Firm* — Fletcher Yoder, P.C.

(57) ABSTRACT

A memory device includes a memory bank accessible via a plurality of memory addresses. The memory device further includes a fuse array including a plurality of fuse banks. A fuse bank of the plurality of fuse banks includes a fuse circuit, which includes a fuse latch having first input circuitry. The fuse latch is implemented to store a first bit of a first memory address received at the first input circuitry. The fuse circuit also includes a matching circuit coupled to the first input circuitry. The matching circuit is implemented to receive a first bit of a second memory address at the first input circuitry and to output, at output circuitry, a comparison result based at least in part on the first bit of the first memory address and the first bit of the second memory address.

20 Claims, 7 Drawing Sheets

REDUCED FOOTPRINT FUSE CIRCUIT

BACKGROUND

Field of the Present Disclosure

The present disclosure relates to circuitry for memory devices, and more specifically, to an improved fuse circuit in memory devices.

Description of Related Art

To improve yield of a memory device, the memory device may be designed to include a number of redundant structures, which may be used to "repair" a damaged and/or inoperative memory address of the memory device. For example, the redundant structures may include a set of redundant memory addresses and a fuse array, among other circuitry. Accordingly, in the case that a memory address is identified as inoperative, the memory device may substitute use of the inoperative memory address with use of an alternative memory address of the set of redundant memory addresses. More specifically, after the inoperative memory address is identified, the fuse array may be programmed to store (e.g., latch) the inoperative memory address. Subsequently, if a command to access memory includes a memory address that matches the inoperative memory address latched in the fuse array, the memory device may be implemented to redirect the command to access the alternative memory address within the set of redundant memory. Moreover, in some cases, to improve the redundancy of the memory device, the memory device may include a greater number of redundant structures, such as additional fuse arrays. However, increasing the number of redundant structures in the memory device may increase the area consumed by the memory device, which may decrease the efficiency and/or may increase the power consumption of the memory device.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in further detail below, embodiments of the present disclosure relate generally to an improved fuse array in a memory device. More specifically, the present disclosure relates to reducing the footprint (e.g., area) of a fuse circuit, which may include a fuse latch (e.g., fuse latch circuitry) and a matching circuit, within the fuse array. In some embodiments, the fuse array may include a set of fuse banks. Each of the set of fuse banks may correspond to a respective inoperative memory address (e.g., row address and/or column address) within a memory array of the memory device. More specifically, a fuse bank may include a set of fuse circuits, where each set of fuse circuits includes a respective fuse latch implemented to latch a respective bit of the inoperative memory address. Each set of fuse circuits may additionally include a respective matching circuit implemented to compare a set of bits, such as the respective latched bit of the inoperative memory address and a respective bit of a memory address received in a command (e.g., a read command and/or a write command). Accordingly, the memory device may use the fuse latches of a fuse bank to store an inoperative memory address, which may be identified during testing of the memory device. Additionally, after receiving a command to access a memory address, the memory device may use the matching circuit of the fuse bank, among other circuitry and/or logic, to determine whether the memory address corresponds to the stored inoperative memory address. Moreover, if the memory device determines the memory address corresponds to the stored inoperative memory address, the memory device may redirect the command to access a redundant memory address associated with the fuse bank. For instance, the memory device may include a fuse and/or an antifuse programmed to substitute the inoperative memory address with the redundant memory address.

In some embodiments, the fuse circuits included in a fuse bank may be implemented with a number of gates, such as field-effect transistors (FETs). Moreover, the fuse latch of a fuse circuit may be implemented in a separate location (e.g., as a separate logic block) in the memory device from the matching circuit of the fuse circuit. Accordingly, to reduce the footprint of the fuse circuit, which may reduce the area consumed by the fuse array and/or the memory device, the number of gates used to implement the fuse circuit may be reduced. More specifically, in some embodiments, the fuse circuit may be implemented such that the fuse latch and the matching circuit share common wiring (e.g., outer nets, nodes, input circuitry, and/or the like), which may reduce the number of gates included in the fuse circuit. Additionally or alternatively, the set of fuse circuits within a fuse bank may be implemented in parallel, which may reduce additional logic used to compare the outputs of the matching circuit within the fuse bank. Further, in some embodiments, the number of fuse circuits included within the fuse bank may be reduced by sharing a fuse circuit having (e.g., storing) a common bit between two or more fuse banks. For example, in the case that a first and second inoperative memory address include a least significant bit (LSB) of '0', a single fuse circuit implemented to store (e.g., latch) '0' may be used by a first fuse bank corresponding to the first inoperative memory address and a second fuse bank corresponding to the second inoperative memory address. Moreover, by reducing the footprint of the fuse circuit, the standby leakage of the memory device may be reduced and/or the area of the fuse array and/or memory array may be reduced, which may result in reduced power consumption and/or increased efficiency of the memory device.

Figure 1:
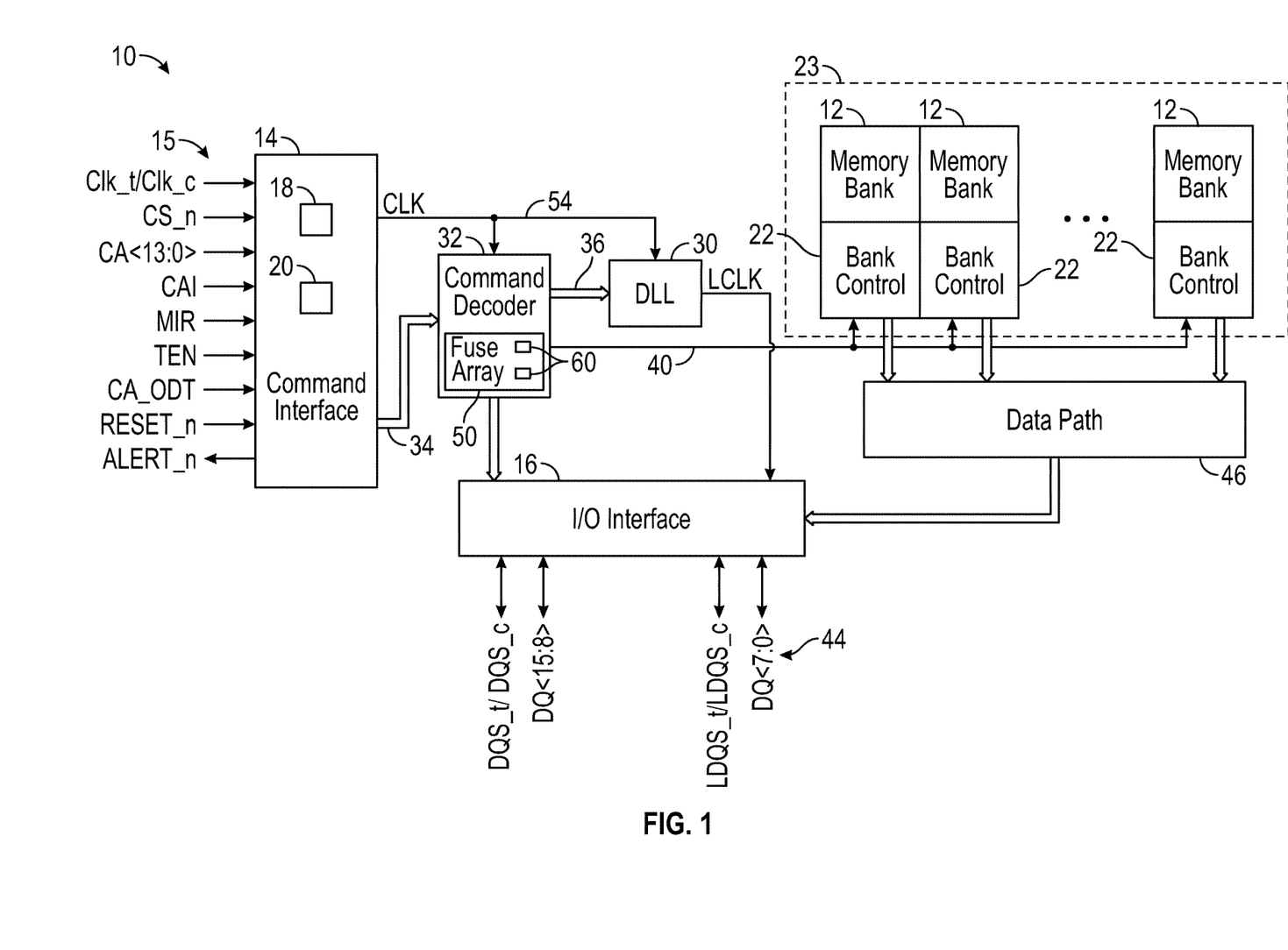
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12, which may include a number of redundant memory addresses. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes.

The data (e.g., IO signals) for read and writes may be addressed to certain memory (e.g., memory cells and/or memory addresses) in the memory banks 12. The techniques described herein provide for a fuse array 50 that includes a number of fuse banks 60. The fuse array 50 and/or the memory device 10 may include circuitry and/or logic to redirect data and/or commands addressed to an inoperative (e.g., damaged) memory address to a redundant (e.g., alternative) memory address of the memory banks 12. Accordingly, in some embodiments, each fuse bank 60 may correspond to a respective identified inoperative memory address of the memory banks 12. Moreover, as described in further detail below, the fuse bank 60 may include a set of fuse circuits, where each fuse circuit is implemented to store, among other things, a respective bit of the respective inoperative memory address, as described in further detail below.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description. For example, the fuse array 50 be disposed within the command decoder 32, as illustrated, within the command interface 14, within one or more bank controls 22, as part of one or more memory banks 12, or a combination thereof.

Figure 2:
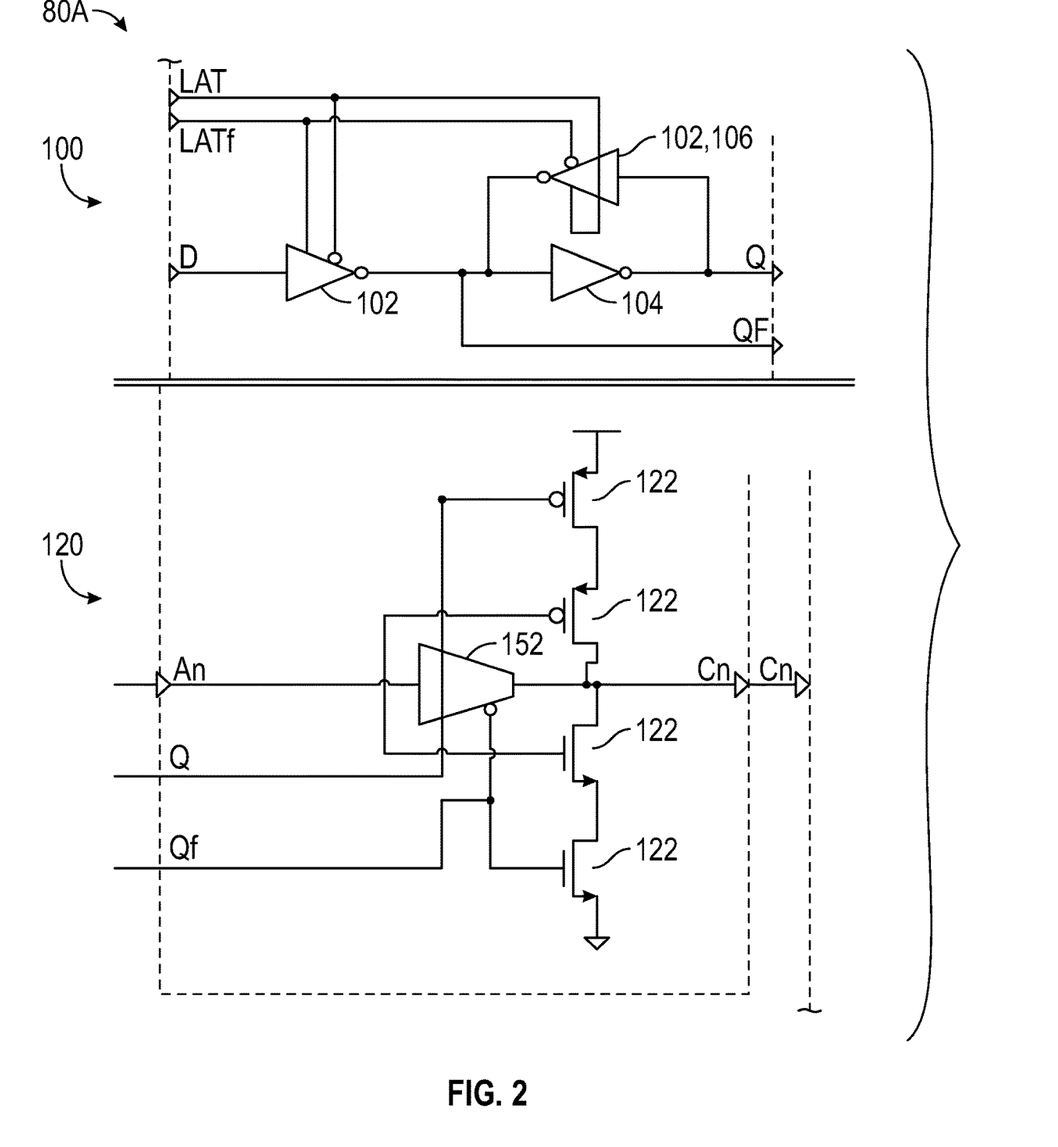
FIG. 2 is a circuit diagram illustrating a first embodiment of a fuse circuit, in accordance with an embodiment.

Turning now to FIG. 2, an example of a fuse circuit 80 is shown. More specifically, a first embodiment of a fuse circuit 80A is illustrated. The fuse circuit 80A may include a fuse latch 100 (e.g., fuse latch circuitry), as well as a matching circuit 120. For simplicity, the fuse latch 100 and the matching circuit 120 are illustrated proximate to one another. However, in certain embodiments, the fuse latch 100 may be implemented in an area of the memory device 10 separate from the matching circuit 120 (e.g., in a separate logic block).

In some embodiments, the fuse latch 100 may be implemented to store (e.g., latch) a bit of an inoperative (e.g., internal) memory address (e.g., row address and/or column address). Further, the matching circuit 120, which may be communicatively coupled to the fuse latch 100, may compare a bit of a memory address received via a command (e.g., an external memory address), such as a read and/or write command, to the bit of the inoperative memory address. In some embodiments, for example, the command may involve a request to access a particular memory address. Accordingly, the matching circuit 120 may determine whether the particular memory address is available for access or whether the memory address corresponds to the inoperative memory address.

Moreover, the memory device 10 may include a set of fuse circuits 80A implemented to store each bit of the inoperative memory address and to compare each bit of the external memory address to each corresponding bit of the inoperative memory address. That is, for example, the memory device 10 may include a fuse bank 60, which may include respective a fuse circuit 80A corresponding to each bit of a particular memory address. Accordingly, while not shown, the fuse circuit 80A may be coupled to and/or may include additional logic, such as a set of logical AND and/or logical NAND gates, implemented to coalesce the results of each matching circuit 120 of the fuse circuits 80A within a fuse bank 60 (e.g., each matching circuit 120 corresponding to a memory address). More specifically, the additional logic may be implemented to determine whether each bit of the external address is the same as the corresponding bit of the inoperative memory address (e.g., whether the external address is the same as the inoperative memory address). In the case that the external address is the same as the inoperative memory address, for example, the additional logic and/or the memory device 10 may be implemented to redirect the memory access to a redundant memory address, as the external (e.g., requested) memory address may be inoperative. On the other hand, if the external address is not the same as the inoperative memory address, the additional logic and/or the memory device 10 may be implemented to access the memory address corresponding to the external memory address.

As illustrated, the fuse latch 100 is implemented with a number of enabled inverters 102, as well as a standard inverter 104. As further illustrated, the fuse latch 100 is implemented to receive a bit of an inoperative (e.g., internal) address signal (D), which represents the inoperative memory address, such as a memory address that is inaccessible and/or damaged. Moreover, the illustrated fuse latch 100 receives a differential pair of latch signals, referred to herein as the true latch signal (Lat) and the complementary latch signal (Latf). When the true latch signal Lat is in a first logical state (e.g., a logical high state), a feedback element 106 (e.g., feedback inverter) of the fuse latch 100 may be activated. That is, for example, the feedback element 106 may turn on based at least in part on the logical state of the true latch signal Lat. Accordingly, in some embodiments, in response to the true latch signal Lat transitioning to the first logical state, the feedback element 106 may activate, and in response to the true latch signal Lat transitioning to a second logical state (e.g., a logical low state), the feedback element 106 may deactivate.

In some embodiments, the feedback element 106 may latch (e.g., store) the bit of the internal address signal D into the fuse latch 100. For instance, during and/or after initialization of the memory device 10 (e.g., device power up), the fuse latch 100 may receive the bit of the internal address signal D, and the true latch signal Lat be in the first logical state. Accordingly, the feedback element 106 may be activated. The true latch signal Lat may then transition to the second logical state, which may cause the feedback element 106 to deactivate and latch the bit of the internal address signal D within the fuse latch 100. Further, in some embodiments, once the true latch signal Lat transitions from the first logical state to the second logical state, the true latch signal Lat may remain in the second logical state. Accordingly, after the initial activation of the feedback element 106 to latch the bit of the internal address signal D, the feedback element 106 may remain deactivated. To that end, in some embodiments, the fuse latch 100 may be implemented to latch a single bit of the internal address signal D, which may remain unchanged throughout operation of the memory device 10.

While the latching of the bit of the internal address signal D is described during and/or after initialization of the memory device 10, it may be appreciated that the bit of the internal address signal D may be latched into the fuse latch 100 in response to any suitable event. For example, in some embodiments, the fuse latch 100 may latch the bit of the internal address signal D in response to a reset of the memory device 10, damage to a particular memory address (e.g., row address and/or column address), and/or the like. More specifically, the memory device 10 may update the logical state of the true latch signal Latin response to any of the suitable events described herein, which may cause the fuse latch 100 to latch the bit of the internal address signal D. Accordingly, embodiments described herein are intended to be illustrative and not limiting.

The fuse latch 100 may output a differential pair of latched data signals, referred to herein as the true latched data signal (Q) and the complementary latched data signal (Qf). The true latched data signal Q may correspond to the data signal currently latched in the fuse latch 100. Accordingly, in some embodiments, the latched data signal Q may correspond to the bit of the internal address signal D latched in the fuse latch 100. Further, the fuse latch 100 may output the differential pair of latched data signals to the matching circuit 120.

The matching circuit 120, such as exclusive OR circuitry (XOR) and/or exclusive NOR (XNOR) circuitry, may include selection circuitry, such as multiplexer 152, as well as a number of gates 122, such as p-type field-effect transistors (FETs) and/or n-type FETs. Further, the matching circuit 120 may receive a bit of an external address signal (An) and the differential pair of latched data signals, as described above. Moreover, the matching circuit 120 may compare the bit of the external address An to the true latched data signal Q to determine whether the signals match (e.g., to determine whether the bit of the external address An matches the bit of the internal address signal D). Based on this comparison, the matching circuit 120 may output (e.g., at output circuitry) a comparison result signal (Cn). In some embodiments, each matching circuit 120 in a fuse bank 60 and/or corresponding to an inoperative memory address may route a respective comparison result signal Cn to the additional logic described above, such as a set of logical AND and/or logical NAND gates. Accordingly, the additional logic may determine whether each comparison result signal Cn indicates a match between the respective external address signal An and internal address signal D bits. To that end, the additional logic may determine whether the external address is the same as the inoperative address.

In some embodiment, each of the enabled inverters 102 may be implemented with four gates (e.g., p-type FETs, n-type FETs, and/or the like), while each of the standard inverters 104 may be implemented with two gates (e.g., p-type FETs, n-type FETs, and/or the like). Accordingly, the illustrated fuse latch 100 is implemented with a total of ten gates, and the illustrated matching circuit 120 is implemented with a total of six gates, including gates 122. To that end, sixteen gates are used to implement the illustrated fuse circuit 80A, and, as discussed above, the fuse bank 60 may include a respective fuse circuit 80A for each bit of a memory address. Accordingly, with increasing memory address lengths and/or with increasing fuse banks 60, which may improve the redundancy of the memory device 10, an increasing area of the memory device 10 may be consumed. As such, the memory device may consume an increasing amount of power, may operate with a decreased efficiency, may include increasing standby leakage, and/or the like.

Figure 3:
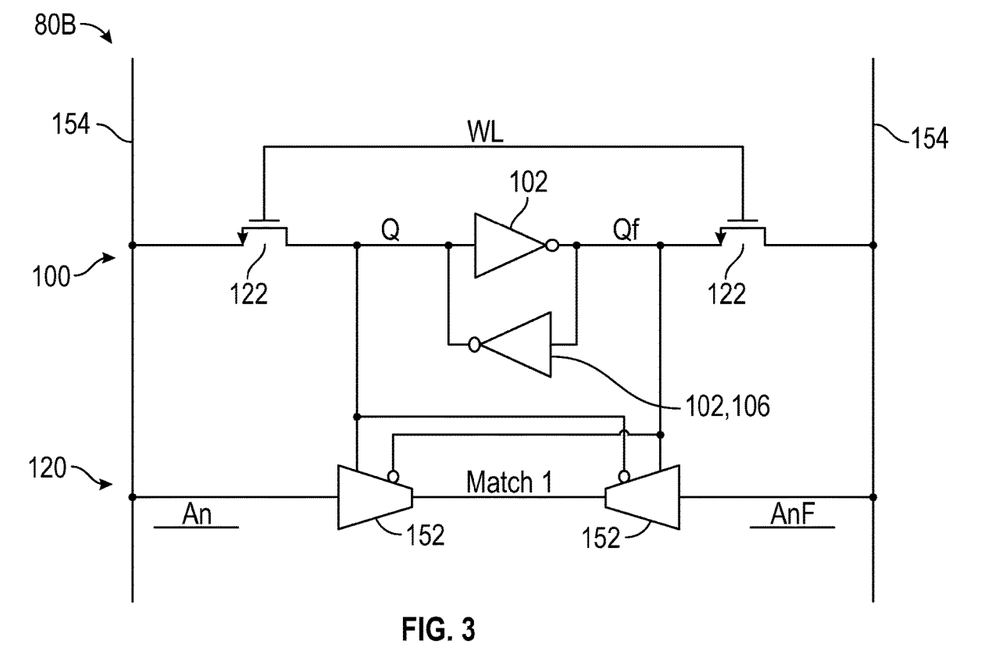
FIG. 3 is a circuit diagram of a second embodiment of a fuse circuit, in accordance with an embodiment.

Accordingly, as illustrated in FIG. 3, in some embodiments, the fuse circuit 80 may be restructured with a reduced footprint (e.g., reduced area). More specifically, a second embodiment of the fuse circuit 80B that is implemented with ten gates is shown in FIG. 3. That is, as illustrated, the second embodiment of the fuse circuit 80B includes a pair of gates 122, a set of enabled inverters 102, and a number of muxes 152 that each include two gates, implemented to form a fuse latch 100 and a matching circuit 120. Moreover, in contrast with the fuse latch 100 and the corresponding matching circuit 120 illustrated in FIG. 2, the fuse latch 100 and the matching circuit 120 of the fuse circuit 80B share common wiring 154 (e.g., connections, outer nets). Accordingly, in some embodiments, the fuse circuit 80B may use the common wiring 154 (e.g., input circuitry) to load the fuse latch 100 (e.g., to latch the bit of the internal address signal D into the fuse latch 100), as well as to send the bit of the external address signal An to the matching circuit 120.

To that end, the illustrated fuse circuit 80B may be implemented as a single logic block.

In operation, the fuse circuit 80B may latch the bit of the internal address signal D, which may be routed along the common wiring 154, into the fuse latch 100 in response to a logical state transition of a write latch signal (WL). For example, as described above with reference to the true latch signal Lat, the feedback element 106 of the fuse latch 100 may be activated while the write latch signal WL is in the first logical state (e.g., a logical high state) and may be deactivated while the write latch signal WL is in the second logical state (e.g., a logical low state). Moreover, after the write latch signal WL transitions from the first logical state to the second logical state, the write latch signal may remain fixed in the second logical state. Accordingly, after latching the bit of the internal address signal D, the feedback element 106 may remain deactivated.

Further, the fuse circuit 80B may route a pair of differential external address signals referred to herein as the external address signal An and the external address signal complement (Anf) along the common wiring 154 to the matching circuit 120. As illustrated, the fuse circuit 80B may also route the differential pair of latched data signals (e.g., the true latched data signal Q and the latched data signal complement Qf) to the matching circuit 120. Accordingly, as described with reference to FIG. 2, the matching circuit 120 of the fuse circuit 80B may compare the bit of the external address signal An with the bit of the internal address signal D latched in the fuse latch 100. If the bit of the external address signal An matches the bit of the true latched data signal Q (e.g., the bit of the internal address signal D), the illustrated matching circuit 120 of the fuse circuit 80A will be set a comparison result signal (Match1) to the first logical state (e.g., the logical high state). Otherwise, the comparison result signal (Match1) will remain in the second logical state (e.g., the logical low state). Moreover, the fuse circuit 80B may route the comparison result signal (Match1) to the additional logic (not shown), such as a set of AND and/or NAND gates, to determine whether each bit of the external address signal An matches each corresponding bit of the internal address signal D. To that end, as described above, each fuse circuit 80B included in a fuse bank 60 may route a respective comparison result signal Match1 to the additional logic to determine whether the external address signal An is the same as the internal address signal D.

Figure 4:
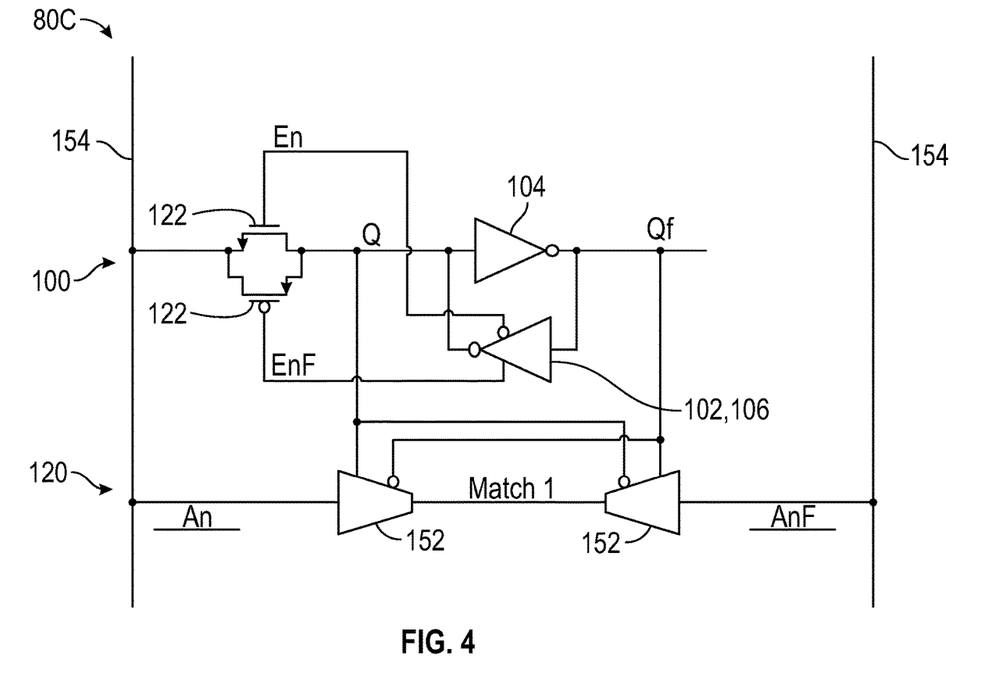
FIG. 4 is a circuit diagram of a third embodiment of a fuse circuit, in accordance with an embodiment.

FIG. 4 illustrates a third embodiment of the fuse circuit 80C. As illustrated, the third embodiment of the fuse circuit 80C includes the same elements (e.g., gates 122, the enabled inverter 102, the standard inverter 104, the number of muxes 152) as the second embodiment of the fuse circuit 80B. Accordingly, the illustrated third embodiment of the fuse circuit 80C also includes twelve gates. However, the gates 122 included in the third embodiment of the fuse circuit 80C are arranged differently in comparison with the gates 122 of the second embodiment of the fuse circuit 80B. Accordingly, while the general operation of the third fuse circuit 80C is the same as the general operation of the second fuse circuit 80B, the feedback element 106 may be activated and deactivated based in part on the logical state of a differential pair of enable signals referred to herein as the true enable signal (En) and the enable complement signal (EnF). That is, for example, the fuse latch 100 may be implemented to latch the internal address signal D when the true enable signal En transitions from the first logical state (e.g., the logical high state) to the second logical state (e.g., the logical low state). Subsequently, the operation of the matching circuit 120 corresponds to the description of the operation of the matching circuit 120 of FIG. 3.

As described above, the memory device 10 may include a respective fuse circuit 80 (e.g., 80A, 80B, 80C, or the like) for each bit of a memory address (e.g., memory row address and/or memory column address). Accordingly, as described above, each of the comparison result signals Cn and/or Match1 corresponding to the comparison of a single pair of bits of a respective external memory address signal An and internal memory address signal D may be routed to additional logic (e.g., logical AND and/or logical NAND gates) to determine whether the entire external address An is the same as the internal address signal D. More specifically, the respective output (e.g., the comparison result signals Cn and/or Match1) of each of a set of fuse circuits 80 included in a fuse bank 60 are routed in series with each other to the additional logic to determine whether the internal address signal An corresponds to an inoperative memory address. In some embodiments, however, the set of fuse circuits 80 in a fuse bank 60 may be communicatively coupled in parallel, as described in further detail below.

Figure 5:
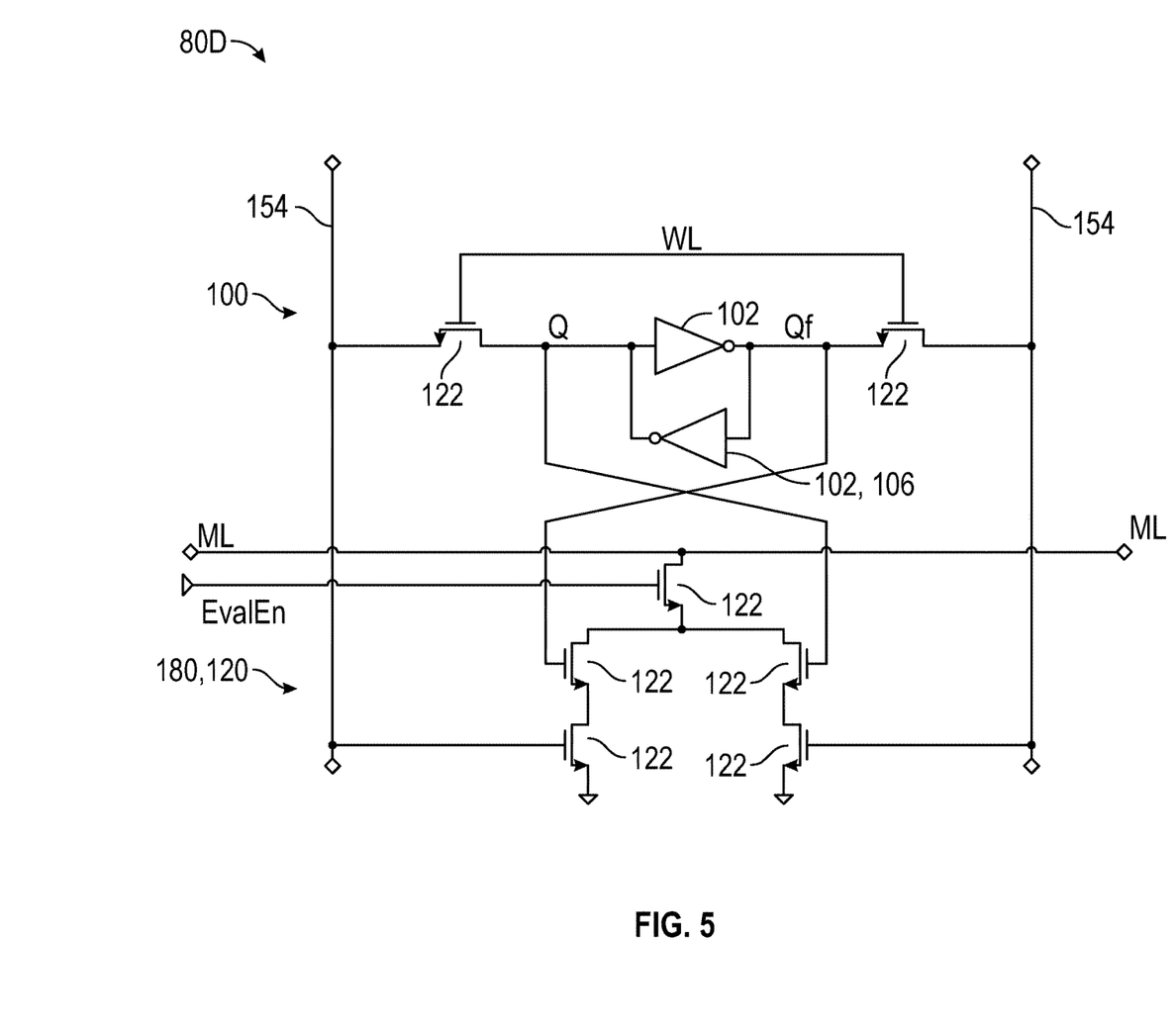
FIG. 5 is a circuit diagram of a fourth embodiment of a fuse circuit, in accordance with an embodiment.

FIG. 5 illustrates a fourth embodiment of the fuse circuit 80D, which includes eleven gates. The illustrated fuse circuit 80D includes the same fuse latch 100 as illustrated and discussed above with reference to the fuse circuit 80B of FIG. 3. Further, the fuse circuit 80D includes a parallel matching circuit 180. As described above with reference to the matching circuit 120, the parallel matching circuit 180 is implemented to compare the true latched data signal Q to the bit of the external address signal An. Accordingly, the parallel matching circuit 180 includes a number of gates 122 implemented to receive the differential pair of latched data signals and the differential pair of external address signals.

Moreover, the parallel matching circuit 180 is implemented to output a result of the comparison on a matching line (ML). For instance, if the true latched data signal Q matches the bit of the external address signal An, the parallel matching circuit 180 may output the first logical state (e.g., the logical high state) to the matching line ML. If the true latched data signal Q does not match the bit of the external address signal An, the parallel matching circuit 180 may output the second logical state (e.g., the logical low state) to the matching line ML. Further, in some embodiments, the matching line ML may be communicatively coupled to a power source. Accordingly, a voltage level of the matching line ML may correspond to the voltage level (Vcc) of the power source. To that end, the matching line ML may be held in the first logical state (e.g., the logical high state).

Figure 6:
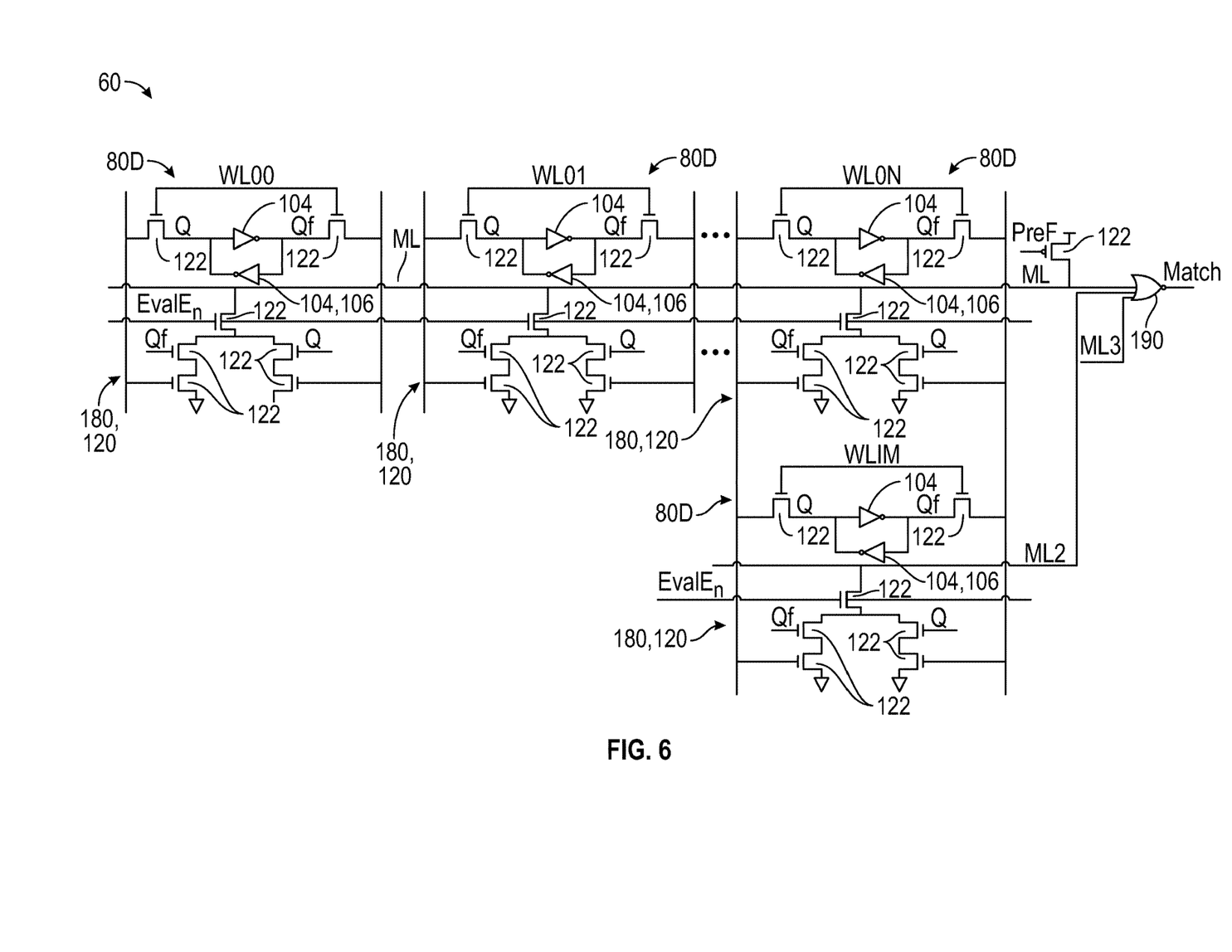
FIG. 6 is a circuit diagram of a fuse bank that includes a number of fuse circuits, in accordance with an embodiment.

Turning now to FIG. 6, in some embodiments, the matching line ML is implemented to communicatively couple a set of fuse circuits 80D in a fuse bank 60 in parallel. As a result, the outputs from the parallel matching circuit 180 of each of the set of fuse circuits 80D may influence the logical state (e.g., the voltage level) of the matching line ML. More specifically, once the voltage level of the matching line ML is set (e.g., to a voltage level corresponding to the first logical state) based on the power source, an evaluation enable signal (EvalEn) may transition from the second logical state to the first logical state, which may allow the output of the parallel matching circuit 180 to be routed to the matching line ML. Subsequently, if any of the parallel matching circuits 180 included in the fuse bank 60 output the second logical state to the matching line ML, the matching line ML will transition from the first logical state to the second logical state. Otherwise, the logical state of the matching line ML will be maintained at the first logical state.

Accordingly, if each of the external address signal An bits match each of the respective true latched data signal bits Q (e.g., respective internal address signal D bits), the matching line ML will remain in the first logical state. On the other hand, if any of the external address signal An bits do not match the corresponding true latched data signal bit Q, the matching line ML will transition from the first logical state to the second logical state. Moreover, each of the matching line signals (e.g., ML, ML2, ML3, and/or the like) included in the fuse bank 60 may be routed to a single gate, such as a logical NOR gate, to determine whether the external address signal An corresponds to an inoperative memory address stored in the fuse bank 60. Accordingly, while the fourth embodiment of the fuse circuit 80D includes eleven gates, the additional logic and the time used to determine whether the external address signal An corresponds to an inoperative memory address may be reduced.

Figure 7:
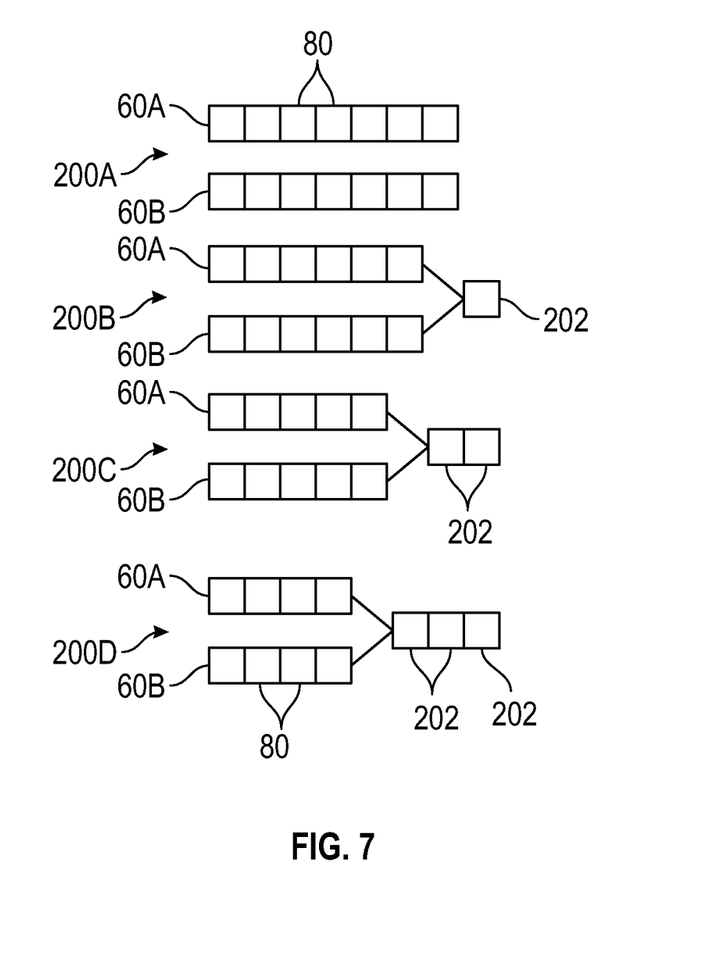
FIG. 7 is a block diagram illustrating fuse circuits storing a portion of a memory address that is shared across the least significant bits of one or more memory addresses, in accordance with an embodiment.

In some embodiments, a first inoperative memory address may share a number of bits in common with a second inoperative memory address. For instance, one or more of the least significant bits (LSBs) of the first inoperative memory address may match one or more LSBs in the corresponding bit positions of the second inoperative memory address. Accordingly, in some embodiments, a fuse circuit 80 (e.g., fuse circuit 80A, fuse circuit 80B, fuse circuit 80C, fuse circuit 80D) may be shared between two or more inoperative memory addresses. That is, for example, a fuse circuit 80 may be shared across multiple fuse banks 60. To help illustrate, a block diagram of this sharing of one or more fuse circuits 80 is shown in FIG. 7. More specifically, FIG. 7 includes a number of fuse circuits 80 that are implemented to store a respective bit of a seven-bit inoperative memory address and are arranged into one or more respective fuse banks 60. While a seven-bit memory address is described herein as an illustrative example, the fuse banks 60 may be implemented with additional or fewer fuse circuits 80 to accommodate any suitable memory address bit width (e.g., a sixteen-bit address, an 18-bit address, a 24-bit address, and/or the like).

As illustrated by a first set of fuse banks 200A, in some embodiments, a first inoperative memory address and a second inoperative memory address may not share any LSBs in common with each other. In such embodiments, a first fuse bank 60A may be implemented to store the first inoperative memory address using a first set of fuse circuits 80, while a second fuse bank 60B may be implemented to store the second inoperative memory address using a second set of fuse circuits 80 that is different from the first set of fuse circuits 80. In other embodiments, the first inoperative memory address and the second inoperative memory address may share a single LSB 202 in common with each other. Accordingly, in such embodiments, the first fuse bank 60A and the second fuse bank 60B may be implemented to share a fuse circuit 80, which may be implemented to store the LSB 202, as illustrated by the second set of fuse banks 200B. Moreover, in some embodiments, the first inoperative memory address and the first inoperative memory address and the second inoperative memory address may share two LSBs 202 or three LSBs 202 with each other. Accordingly, the first fuse bank 60A and the second fuse bank 60B may be implemented to share a pair of fuse circuits 80 or a set of three circuits 80, as illustrated by the third set of fuse banks 200C and the fourth set of fuse banks 200D, respectively. Moreover, it may be appreciated that the first and second inoperative memory address may share any suitable number of LSBs 202 in common with each other. As such, the first fuse bank 60A and the second fuse bank 60B may be implemented to share any suitable number of fuse circuits 80.

Figure 8:
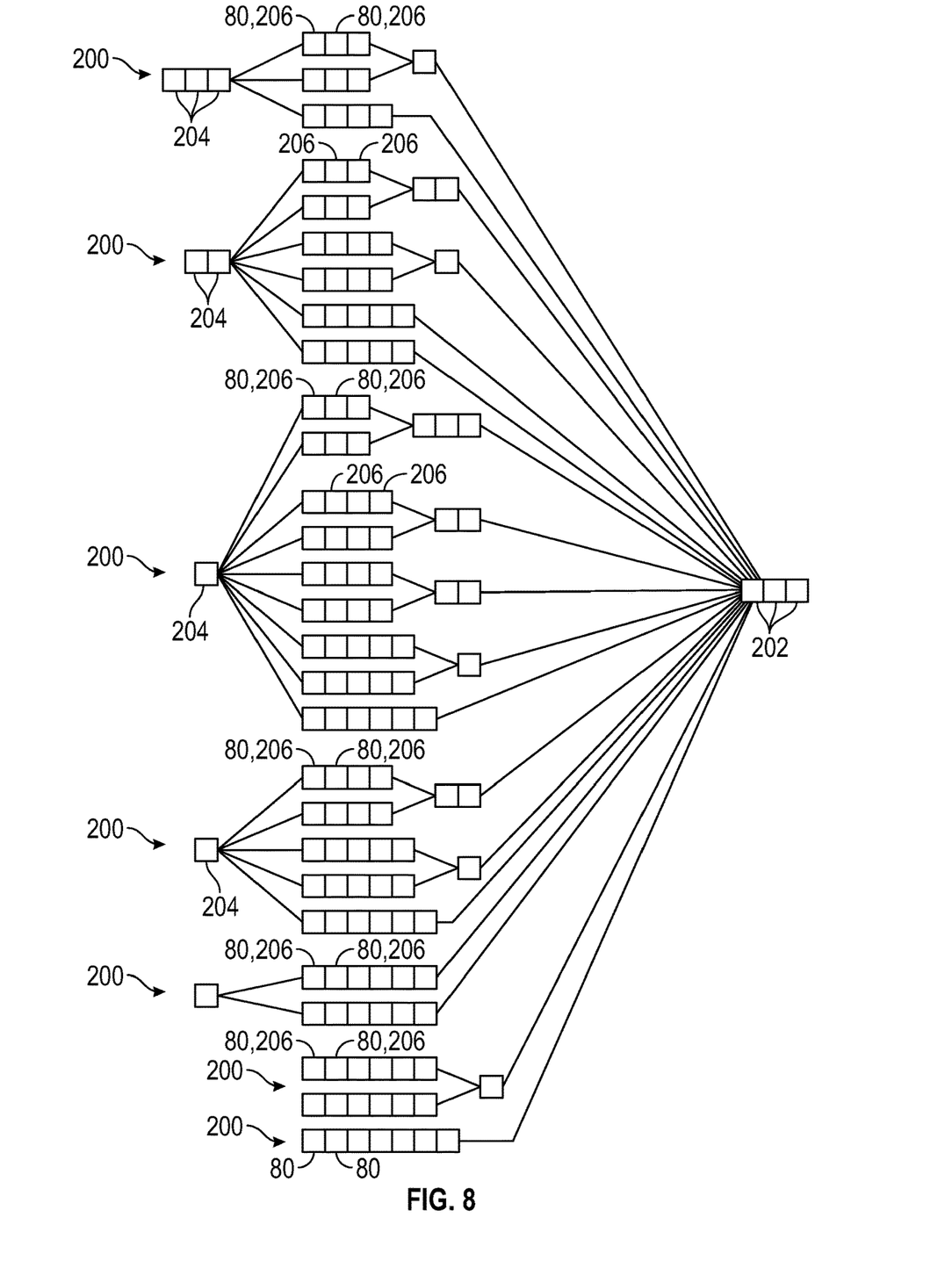
FIG. 8 is a block diagram illustrating fuse circuits storing a portion of a memory address that is shared across one or bits of one or more memory addresses, in accordance with an embodiment.

Turning now to FIG. 8, while the sharing of a fuse circuit 80 between bits of separate inoperative memory addresses is described above with reference to common LSBs 202, the fuse circuit 80 may additionally or alternatively be shared between common most significant bits 204 (MSBs) of separate inoperative memory addresses. Moreover, in some embodiments, the fuse circuit 80 may be shared between another subset of bits of shared by inoperative memory addresses, such as bits that are neither MSBs nor LSBs 202, such as internal bits 206. Further, a combination of MSBs 204, LSBs 202, internal bits 206, and/or the like may be shared between a set of fuse banks 200. Moreover, while a pair of fuse banks 60 (e.g., 60A and 60B) are described herein as sharing one or more fuse circuits 80, any suitable number (e.g., 3, 5, 10, and/or the like) of fuse banks 60 implemented to store a common set of one or more bits may be implemented to share a fuse circuit 80. Thus, embodiments described herein are intended to be illustrative and not limiting.

Moreover, while the feedback element 106 (e.g., feedback inverter) illustrated in FIGS. 2 and 4 is described herein as being an enabled inverter 102, in some embodiments, the feedback element 106 may be implemented with a standard inverter 104. Similarly, while the while the feedback element 106 (e.g., feedback inverter) illustrated in FIGS. 3 and 5 is described herein as being an standard inverter 104, in some embodiments, the feedback element 106 may be implemented with an enabled inverter 102. Further, while a first logical state and a second logical state are described herein as a logical high state and a logical low state, respectively, the memory device 10 may be implemented to operate using signals having any suitable logical state. For instance, inverse signal states and/or logic circuitry, such as logical NAND gates in place of logical AND gates or vice versa, logical XNOR gates in place of logical XOR gates or vice versa, and/or the like, may be implemented to perform the functions described herein. Thus, embodiments described herein are intended to be illustrative and not limiting.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a memory bank accessible via a plurality of memory addresses; and
   a fuse array comprising a plurality of fuse banks, wherein a first fuse bank of the plurality of fuse banks comprises a first fuse circuit, wherein the first fuse circuit comprises:
      a first fuse latch comprising first input circuitry, wherein the first fuse latch is configured to store a first bit of a first memory address of the plurality of memory addresses received at the first input circuitry; and
      a first matching circuit communicatively coupled to the first input circuitry, wherein the first matching circuit is configured to:
         receive, at the first input circuitry, a first bit of a second memory address of the plurality of memory addresses; and
         output, at output circuitry of the first matching circuit, a first comparison result based at least in part on the first bit of the first memory address and the first bit of the second memory address.

2. The memory device of claim 1, wherein the plurality of memory addresses comprises a plurality of row addresses and a plurality of column addresses.

3. The memory device of claim 1, wherein the first fuse bank comprises a second fuse circuit, wherein the second fuse circuit comprises:
   a second fuse latch comprising second input circuitry, wherein the second fuse latch is configured to store a second bit of the first memory address received at the second input circuitry; and
   a second matching circuit communicatively coupled to the second input circuitry, wherein the second matching circuit is configured to:
      receive, at the second input circuitry, a second bit of the second memory address; and
      output, at output circuitry of the second matching circuit, a second comparison result based at least in part on the second bit of the first memory address and the second bit of the second memory address.

4. The memory device of claim 3, wherein the output circuitry of the first matching circuit and the output circuitry of the second matching circuit are communicatively coupled in parallel.

5. The memory device of claim 3, wherein the output circuitry of the first matching circuit and the output circuitry of the second matching circuit are communicatively coupled in series.

6. The memory device of claim 3, wherein the output circuitry of the first matching circuit and the output circuitry of the second matching circuit are both communicatively coupled to a logical AND gate, a logical NAND gate, or a combination thereof.

7. The memory device of claim 1, wherein the plurality of memory addresses comprises a plurality of redundant memory addresses.

8. The memory device of claim 7, wherein the first matching circuit is configured to receive the first bit of the second memory address in response to receiving, at the memory device, a command to access the second memory address, and wherein the memory device is configured to access one of the plurality of redundant memory addresses different from the second memory address based at least in part on the first comparison result.

9. The memory device of claim 1, wherein the memory device comprises a matching line communicatively coupled to a power source of the memory device configured to output a first logical state on the matching line, wherein the output circuitry of the first matching circuit is communicatively coupled to the matching line, and wherein the matching line is configured to transition from the first logical state to a second logical state based at least in part on the first comparison result.

10. The memory device of claim 1, wherein each of the plurality of fuse banks corresponds to a respective address of the plurality of memory addresses.

11. The memory device of claim 1, wherein the memory device is a double data rate type five (DDR5) memory device.

12. A method, comprising:
   receiving, at first input circuitry, a first bit of a first memory address of a plurality of memory addresses of a memory device;
   latching, at a first fuse latch communicatively coupled to the first input circuitry, the first bit of the first memory address;
   receiving, at the first input circuitry, a first bit of a second memory address of the plurality of memory addresses;
   determining, at a first matching circuit communicatively coupled to the first input circuitry, a first comparison result based at least in part on the first bit of the first memory address and the second bit of the second memory address, wherein the first matching circuit is configured to receive the first bit of the first memory address from the first fuse latch; and
   outputting, at output circuitry of the first matching circuit, the first comparison result.

13. The method of claim 12, comprising receiving the first bit of the first memory address after determining the first memory address is inoperative.

14. The method of claim 12, comprising receiving the first bit of the second memory address at the first matching circuit after receiving, at the memory device, a command to access the second memory address.

15. The method of claim 12, comprising latching, at the first fuse latch, the first bit of the first memory address in response to identifying, at second input circuitry communicatively coupled to the first fuse latch, a transition of a latch signal from a first logical state to a second logical state.

16. The method of claim 15, comprising transitioning the latch signal from the first logical state to the second logical state during an initialization of the memory device.

17. A system, comprising:
   a first fuse latch comprising first input circuitry, wherein the first fuse latch is configured to store a first bit of a first memory address of a plurality of memory addresses of a memory bank received at the first input circuitry, wherein the first memory address comprises an inoperative memory address of the memory bank; and
   a first matching circuit communicatively coupled to the first input circuitry, wherein the first matching circuit is configured to:
      receive, at the first input circuitry, a first bit of a second memory address of the plurality of memory addresses; and
      output, at output circuitry of the first matching circuit, a first comparison result based at least in part on a comparison of the first bit of the first memory address and the first bit of the second memory address.

18. The system of claim 17, wherein the first bit of the first memory address comprises a first bit of a third memory address of the plurality of memory addresses, wherein the third memory address comprises an additional inoperative memory address of the memory bank.

19. The system of claim 18, comprising a first fuse bank and a second fuse bank, wherein the first fuse bank comprises the first fuse latch and the first matching circuit, wherein the second fuse bank comprises:
- a second fuse latch comprising second input circuitry, wherein the second fuse latch is configured to store a second bit of the third memory address received at the second input circuitry; and
- a second matching circuit communicatively coupled to the second input circuitry, wherein the second matching circuit is configured to:
  - receive, at the second input circuitry, a second bit of the second memory address; and
  - output, at output circuitry of the second matching circuit, a second comparison result based at least in part on additional comparison of the second bit of the third memory address and the second bit of the second memory address.

20. The system claim 17, wherein the first matching circuit comprises a multiplexer.

* * * * *